United States Patent
Guo et al.

(10) Patent No.: US 10,809,409 B2
(45) Date of Patent: Oct. 20, 2020

(54) METHOD AND CIRCUIT FOR DETECTING MEDIA AT DIFFERENT DEPTHS

(71) Applicant: ZHANGZHOU EASTERN INTELLIGENT INSTRUMENT CO., LTD., Zhangzhou (CN)

(72) Inventors: Mingfeng Guo, Zhangzhou (CN); Zhihong Chen, Zhangzhou (CN); Fanjian Zeng, Zhangzhou (CN); Hailin Huang, Zhangzhou (CN)

(73) Assignee: ZHANGZHOU EASTERN INTELLIGENT INSTRUMENT CO., LTD., Zhangzhou (CN)

( * ) Notice: Subject to any disclaimer, the term of this patent is extended or adjusted under 35 U.S.C. 154(b) by 827 days.

(21) Appl. No.: 15/598,245

(22) Filed: May 17, 2017

(65) Prior Publication Data

US 2018/0335539 A1 Nov. 22, 2018
US 2020/0209423 A9 Jul. 2, 2020

Related U.S. Application Data

(63) Continuation of application No. PCT/CN2015/085038, filed on Jul. 24, 2015.

(30) Foreign Application Priority Data

Jul. 2, 2015 (CN) .......................... 2015 1 0380864

(51) Int. Cl.
*G01V 3/08* (2006.01)
*G01N 27/20* (2006.01)
*H03K 19/20* (2006.01)

(52) U.S. Cl.
CPC ............. *G01V 3/088* (2013.01); *G01N 27/20* (2013.01); *H03K 19/20* (2013.01)

(58) Field of Classification Search
None
See application file for complete search history.

(56) References Cited

U.S. PATENT DOCUMENTS

| 4,009,118 A | 2/1977 | Laiho |
| 5,917,314 A | 6/1999 | Heger et al. |
| 7,205,775 B2* | 4/2007 | Kreit .................. G01D 5/2073 324/228 |
| 2004/0000918 A1 | 1/2004 | Sanoner et al. |

(Continued)

*Primary Examiner* — Douglas X Rodriguez

(57) ABSTRACT

The method comprises the steps of: first, providing a sensor, the sensor consisting of a group of PCB copper foils; second, providing a depth detection signal Ftest which can change the detection frequency along with the change in detection depth, and applying the depth detection signal Ftest to the big and small polar plates of the sensor in the step S01 to form an electromagnetic field between the big polar plate and the small polar plates; third, providing a self-calibration signal Fcal acting on the big polar plate, to adjust a phase difference between the big polar plate and the small polar plates, thereby improving the detection sensitivity; and finally, performing shaping and phase comparison on signals output from the big and small polar plates driven by the depth detection signal Ftest, and processing signals output after filtering the phase-compared signals to judge the condition of a medium at the current detection depth.

9 Claims, 1 Drawing Sheet

(56) References Cited

U.S. PATENT DOCUMENTS

2007/0210785 A1* 9/2007 Sanoner ............... G01V 3/088
                                                    324/67
2008/0238403 A1   10/2008 Sanoner et al.
2013/0207674 A1*  8/2013 Hahl .................... G01F 23/266
                                                    324/672

* cited by examiner

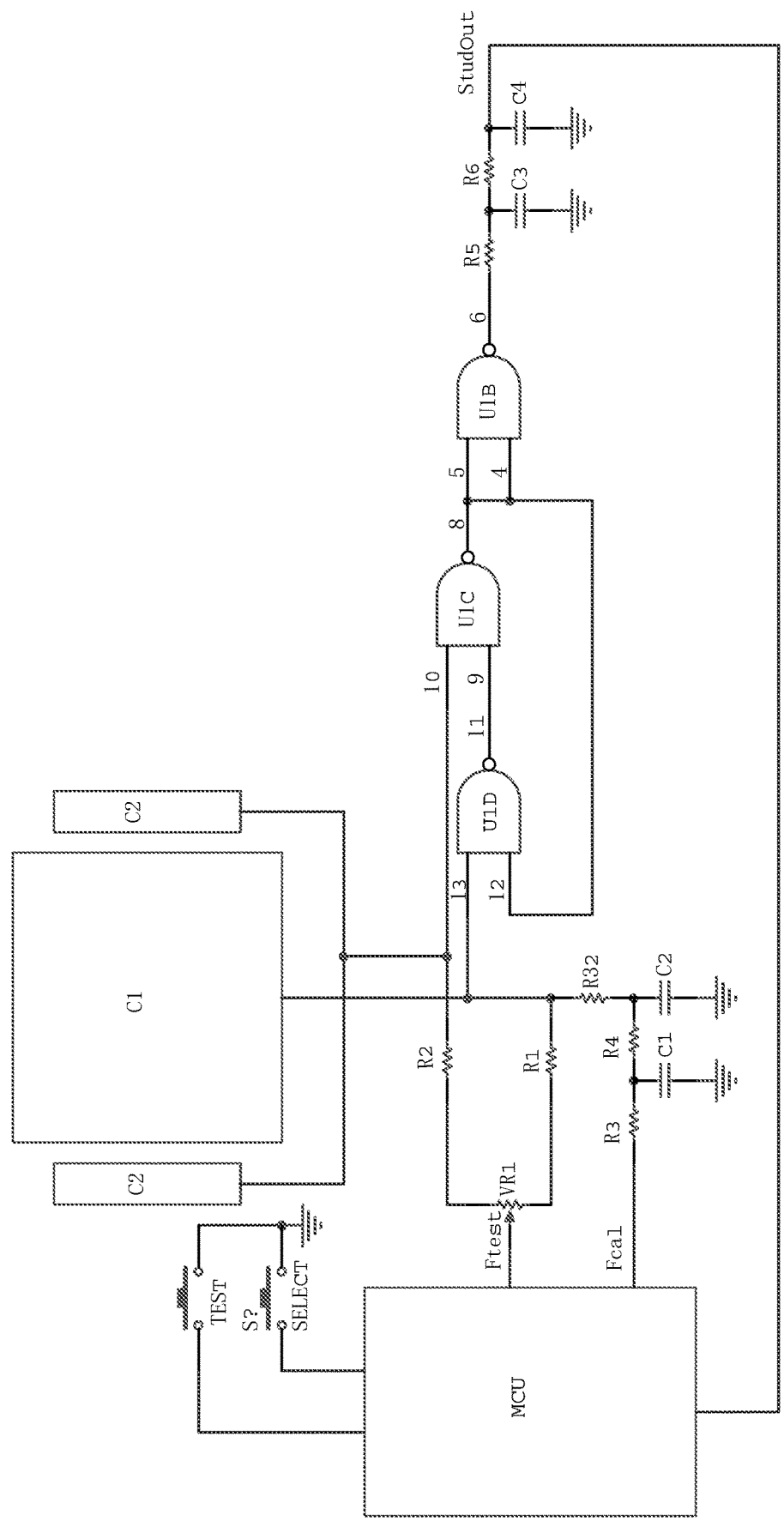

METHOD AND CIRCUIT FOR DETECTING MEDIA AT DIFFERENT DEPTHS

RELATED APPLICATION

The present application claims priority to CN201510380864.5 filed Jul. 2, 2015, which is incorporated herein by reference in its entirety.

FIELD OF THE INVENTION

The present invention relates to medium detection. In particular, the invention relates to a method and circuit for detecting media at different depths.

BACKGROUND OF THE INVENTION

Medium detectors, as one kind of products, have already come to market for many years. A core component of a medium detector is a detection sensor consisting of parallel plate capacitors (referring to U.S. Pat. No. 4,099,118). When a dielectric medium between the parallel plate capacitors changes, the capacitance of the parallel plate capacitors will also change, so that the presence of a medium may be judged according to this change. In the existing technical methods, a detection signal with a fixed frequency is applied to a sensor. When the detection depth is large, the penetrability of the sensor becomes weaker, and the signal is very weak and needs to be simplified by an additional operational amplifier in the later stage. In the present parented technology, the detection of media at different depths may be realized without an additional operational amplifier.

OBJECTS AND SUMMARY OF THE INVENTION

An objective of the present invention is to provide a method and circuit for detecting media at different depths, which may realize the detection of media at difference depths without an additional operational amplifier.

For this purpose, the present invention employs the following technical solutions: a method for detecting media at different depths is provided, including the following steps of:

S01: providing a sensor, the sensor consisting of a group of PCB copper foils, i.e., a big copper foil which is used as a big polar plate and two small copper foils which are used as small polar plates;

S02: providing a depth detection signal Ftest which can change the detection frequency along with the change in detection depth, and applying the depth detection signal Ftest to the big and small polar plates of the sensor in the S01 to form an electromagnetic field between the big polar plate and the small polar plates;

S03: providing a self-calibration signal Fcal acting on the big polar plate, to adjust a phase difference between the big polar plate and the small polar plates, thereby improving the detection sensitivity; and S04: performing shaping and phase comparison on signals output from the big and small polar plates driven by the depth detection signal Ftest, and processing signals output after filtering the phase-compared signals to judge the condition of a medium at the current detection depth.

In an embodiment of the present invention, the big polar plate and the small polar plates are connected with a first resistor and a second resistor to form a first RC circuit and a second RC circuit, respectively.

In an embodiment of the present invention, before acting on the big polar plate, the self-calibration signal Fcal is to be filtered by a second-order RC filter circuit.

In an embodiment of the present invention, the self-calibration signal Fcal is a PWM signal with a fixed frequency and a variable duty ratio generated by a PWM calibration circuit, and the phase difference between the big polar plate and the small polar plates can be changed by changing the duty ratio of the PWN signal.

In an embodiment of the present invention, in the step S04, the processing signals output after filtering the phase-compared signals is processing the signals by an MCU or an analog comparator.

The present invention further provides a circuit for detecting media at different depths, including an MCU, a sensor, a potentiometer, first to third resistors, a signal shaping and phase comparison circuit, a filter circuit, and first to second second-order RC filter circuits;

the sensor consists of a group of PCB copper foils, i.e., a big copper foil which is used as a big polar plate and two small copper foils which are used as small polar plates, wherein the big and small polar plates of the sensor and the first and second resistors form first and second RC circuits, respectively;

the MCU outputs, to input terminals of the first and second RC circuits via the potentiometer, a depth detection signal Ftest which can change the detection frequency along with the change in detection depth; and the MCU further outputs, to the big polar plate via the first second-order RC filter circuit and the third resistor, a self-calibration signal Fcal used for adjusting a phase difference between the big polar plate and the small polar plates; and RC signals generated by the first and second RC circuits are fed back to the MCU through the signal shaping and phase comparison circuit and the filter circuit, and then processed by the MCU to judge the condition of a medium at the current detection depth.

In an embodiment of the present invention, the signal shaping and phase comparison circuit includes a first NAND gate and a second NAND gate; a first input terminal of the first NAND gate is connected to the big polar plate, a second input terminal thereof is connected to an output terminal of the second NAND gate and serves as an output terminal of the signal shaping and phase comparison circuit, and an output terminal thereof is connected to a second output terminal of the second NAND gate; and, a first input terminal of the second NAND gate is connected to the small polar plates.

In an embodiment of the present invention, the filter circuit is a third NAND gate.

In an embodiment of the present invention, the self-calibration signal Fcal is a PWM signal with a fixed frequency and a variable duty ratio generated by the MCU, and the phase difference between the big polar plate and the small polar plates can be changed by changing the duty ratio of the PWN signal.

Compared with the prior art, the present invention has the following beneficial effects:

1. in the detection circuit of the present invention, compared with the conventional circuits, analog devices such as an operational amplifier are omitted, and the circuit is very simple and digitized completely; moreover, only if the parameters are adjusted well in the earlier stage, the detection circuit may be produced on a large scale, and has an excellent consistency; and 2. if the detection circuit cooperates with the MCU software, more flexible functions may be realized.

BRIEF DESCRIPTION OF FIGURES

FIG. 1 is a principle block diagram of a circuit according to the present invention.

DETAILED DESCRIPTION OF THE EMBODIMENTS

The technical solutions of the present invention will be specifically described below with reference to the accompanying drawings.

The present invention provides a method for detecting media at different depths, including the following steps of:

S01: providing a sensor, the sensor consisting of a group of PCB copper foils, i.e., a big copper foil which is used as a big polar plate and two small copper foils which are used as small polar plates;

S02: providing a depth detection signal Ftest which can change the detection frequency along with the change in detection depth, and applying the depth detection signal Ftest to the big and small polar plates of the sensor in the S01 to form an electromagnetic field between the big polar plate and the small polar plates (the big and small polar plates are connected to first and second resistors to form first and second RC circuits, respectively);

S03: providing a self-calibration signal Fcal acting on the big polar plate, to adjust a phase difference between the big polar plate and the small polar plates, thereby improving the detection sensitivity, wherein, before acting on the big polar plate, the self-calibration signal Fcal is to be filtered by a second-order RC filter circuit; the self-calibration signal Fcal is a PWM signal with a fixed frequency and a variable duty ratio generated by a PWM calibration circuit, and the phase difference between the big polar plate and the small polar plates can be changed by changing the duty ratio of the PWN signal; and S04: performing shaping and phase comparison on signals output from the big and small polar plates driven by the depth detection signal Ftest, and processing signals output after filtering the phase-compared signals (processing the signals by an MCU or an analog comparator) to judge the condition of a medium at the current detection depth.

A circuit for implementing the method is as follows:

a circuit for detecting media at different depths is provided, including an MCU, a sensor, a potentiometer, first to third resistors, a signal shaping and phase comparison circuit, a filter circuit, and first to second second-order RC filter circuits;

the sensor consists of a group of PCB copper foils, i.e., a big copper foil which is used as a big polar plate and two small copper foils which are used as small polar plates, wherein the big and small polar plates of the sensor and the first and second resistors form first and second RC circuits, respectively;

the MCU outputs, to input terminals of the first and second RC circuits via the potentiometer, a depth detection signal Ftest which can change the detection frequency along with the change in detection depth; and the MCU further outputs, to the big polar plate via the first second-order RC filter circuit and the third resistor, a self-calibration signal Fcal used for adjusting a phase difference between the big polar plate and the small polar plates (the self-calibration signal Fcal is a PWM signal with a fixed frequency and a variable duty ratio generated by the MCU, and the phase difference between the big polar plate and the small polar plates can be changed by changing the duty ratio of the PWN signal); and RC signals generated by the first and second RC circuits are fed back to the MCU through the signal shaping and phase comparison circuit and the filter circuit, and then processed by the MCU to judge the condition of a medium at the current detection depth.

The signal shaping and phase comparison circuit includes a first NAND gate and a second NAND gate; a first input terminal of the first NAND gate is connected to the big polar plate, a second input terminal thereof is connected to an output terminal of the second NAND gate and serves as an output terminal of the signal shaping and phase comparison circuit, and an output terminal thereof is connected to a second output terminal of the second NAND gate; and, a first input terminal of the second NAND gate is connected to the small polar plates. The filter circuit is a third NAND gate.

Specific embodiments of the present invention will be described below.

As shown in FIG. 1, the resistor R1 and the big polar plate C1 of the sensor forms a first RC circuit, which is defined as R1C1;

the resistor R2 and the small polar plates C2 of the sensor form a second RC circuit, which is defined as R2C2; and digital circuits U1C and U1D cooperatively perform shaping and phase comparison on the R1C1 and R2C2 (logic NAND operations are performed on the two signals). The circuits are important components for realizing signal detection.

The digital circuit U1B realizes the function of reshaping comparison signals output from the U1C and U1D. This circuit actually realizes the phase difference function of two polar plate signals.

R3, C1 and R4, C2 form a second-order RC filter circuit. This circuit mainly functions to convert the calibration signal (the PWM signal with a variable duty ratio) of the system into a DC voltage signal.

R5, C3 and R6, C4 form a second-order RC filter circuit. This circuit mainly functions to convert a phase difference signal into a DC signal for further use in a subsequent circuit.

The working principle of the whole circuit is as follows:

After the circuit operates in a normal state and when a detection function is triggered, a square wave signal with a fixed frequency will be input into Ftest. It can be seen from FIG. 1 that, this signal is connected to the R1C1 and R2C2, respectively, to constantly charge or discharge the R1C1 and R2C2 in terms of the circuit structure. The R1C1 and R2C2 then generate RC charge/discharge signals. The signals enter the shaping and signal phase comparison circuit formed by the U1D, U1B and U1C, and a phase difference signal of the two RC signals is eventually obtained.

After the beginning of a test, with the progress of the detection, once the ratio of compositions of a medium under a region to be detected changes greatly, the capacitance of a parallel plate capacitor will also change, that is, the capacitance of the big and small polar plates changes. The RC charge/discharge circuit will cause a change in signal flatness due to the change in capacitance. Since the threshold voltage of a digital gate circuit is constant, the flatness of the RC signal will directly influence the phase of the shaped signal relative to the driving signal. This is the basic principle of the detection function.

It is to be noted that, the driving signal of the two polar plates is a same signal Ftest, and the big and small polar plates are difference in area. Therefore, after the R1C1 and R2C2 are shaped and compared, the obtained phase difference is certainly different. Due to different initial detection positions, the initial phase difference is certainly different. If the initial phase difference is very small, the phase difference output signal in the later stage is very obvious when the relative positions the two polar plates are changed slightly. If the initial phase difference is very large, the influence of the change in relative position of the two polar plates on the later-stage phase difference signal will be reduced greatly. Accordingly, the sensitivity of the system is very low.

Based on the above analysis, it is required to calibrate the relative initial phase difference between the two polar plate signals, so as to minimize the relative initial phase difference. Hence, a PWM calibration circuit is provided. At the beginning of calibration, the system will output a PWM signal (the Fcal signal in FIG. 1) with a fixed frequency and a variable duty ratio. This signal experiences second-order RC filtering, and is applied to the big polar plate. Thus, it is equivalent to superpose a voltage signal onto the big polar plate. Consequently, the signal amplitude of the big polar plate will be increased, and the signal flatness is also changed. As described above, since the threshold voltage of the digital gate circuit is constant, the phase of the shaped signal (relative to the driving signal) will be directly influenced if the signal flatness is changed. Therefore, the relative phase of the signal from the big polar plate may be indirectly changed by changing the duty ratio of the PWM. However, the signals from the small polar plates remain unchanged during the calibration process. Thus, the phase difference between the big polar plate and the small polar plates will change with the change of the duty ratio of the PWM. Once the relative phase difference between the big polar plate and the small polar plates is minimal, the voltage signal output from the last-stage second-order RC filter is also minimal. In this case, the circuit is in a maximum sensitivity state.

Once the self-calibration is accomplished, the system is in the optimal sensitivity state, and may perform detection operations normally.

It is well-known that a relationship between the penetrability and the transmitting frequency of the electromagnetic field is as follows: when the signal frequency is higher, the signal will be greatly attenuated when penetrating an object, that is, the penetrability becomes weaker. However, a very high detection accuracy may be obtained at a high frequency. If the signal frequency is lower, the penetrability of signals is higher, but the accuracy is slightly lower.

Hence, tests may be performed at different frequencies, and proper frequencies corresponding to different depths may be obtained as long as insufficient tests have been performed. In the present patent, tests are performed on gypsum boards which are 7 mm, 25.4 mm and 38 mm in thickness, respectively. Equivalent variations and modifications made with the patent scope of the present invention shall fall into the scope embraced by the present invention.

When the tested thickness is 12 mm, the reflected signal is strong theoretically since the tested thickness is thin. Therefore, a detection signal with a high frequency may be used here, so that a high detection accuracy is obtained under the premise of ensuring the detection depth. After experiment, the testing frequency may be set as 20 KHz (square wave with a duty ratio of 50%).

When the tested thickness is 25.4 mm, the reflected signal is not weak theoretically since the detection thickness is moderate. In this case, there should be a certain sensitivity allowance. After experiment, it can be determined that, at 15 KHz (the waveform is the same as above), the sensitivity and the testing accuracy at 25.4 mm may be ensured.

When the tested thickness is 38 mm, the penetrability of signals is very weak, and the reflected signal is also weak.

In this case, the frequency of the detection signal should be reduced. After experiment, the frequency may be determined as 10 KHz.

The foregoing description shows preferred embodiments of the present invention. All variations made to the technical solutions of the present invention shall fall into the protection scope of the present invention when the generated functional effects are within the scope of the technical solutions of the present invention.

What is claimed is:

1. A method for detecting media at different depths, comprising the following steps of:
   S01: providing a sensor, the sensor comprising a group of PCB copper foils, the PCB copper foils comprising a big copper foil which is used as a big polar plate and two small copper foils which are used as small polar plates;
   S02: providing a depth detection signal Ftest which can change the detection frequency along with the change in detection depth, and applying the depth detection signal Ftest to the big and small polar plates of the sensor in the S01 to form an electromagnetic field between the big polar plate and the small polar plates;
   S03: providing a self-calibration signal Fcal acting on the big polar plate, to adjust a phase difference between the big polar plate and the small polar plates, thereby improving the detection sensitivity; and
   S04: providing a circuit to perform shaping and phase comparison on signals output from the big and small polar plates driven by the depth detection signal Ftest, and processing signals output after filtering the phase-compared signals to judge the condition of a medium at the current detection depth, wherein:
   the circuit comprises a first NAND gate and a second NAND gate; a first input terminal of the first NAND gate is connected to the big polar plate, a second input terminal thereof is connected to an output terminal of the second NAND gate and serves as an output terminal of the signal shaping and phase comparison circuit, and an output terminal thereof is connected to a second output terminal of the second NAND gate; and, a first input terminal of the second NAND gate is connected to the small polar plates.

2. The method for detecting media at different depths according to claim 1, characterized in that the big polar plate and the small polar plates are connected with a first resistor and a second resistor to form a first RC circuit and a second RC circuit, respectively.

3. The method for detecting media at different depths according to claim 1, characterized in that, before acting on the big polar plate, the self-calibration signal Fcal is to be filtered by a second-order RC filter circuit.

4. The method for detecting media at different depths according to claim 3, characterized in that the self-calibration signal Fcal is a PWM signal with a fixed frequency and a variable duty ratio generated by a PWM calibration circuit, and the phase difference between the big polar plate and the small polar plates can be changed by changing the duty ratio of the PWN signal.

5. The method for detecting media at different depths according to claim 1, characterized in that the self-calibration signal Fcal is a PWM signal with a fixed frequency and a variable duty ratio generated by a PWM calibration circuit, and the phase difference between the big polar plate and the small polar plates can be changed by changing the duty ratio of the PWN signal.

6. The method for detecting media at different depths according to claim 1, characterized in that, in the step S04, the processing signals output after filtering the phase-compared signals is processing the signals by an MCU or an analog comparator.

7. A circuit for detecting media at different depths, comprising an MCU, a sensor, a potentiometer, first to third resistors, a signal shaping and phase comparison circuit, a filter circuit, and first to second second-order RC filter circuits, wherein:
- the sensor comprising a group of PCB copper foils, the PCB copper foils comprising a big copper foil which is used as a big polar plate and two small copper foils which are used as small polar plates, wherein the big and small polar plates of the sensor and the first and second resistors form first and second RC circuits, respectively;
- the MCU outputs, to input terminals of the first and second RC circuits via the potentiometer, a depth detection signal Ftest which can change the detection frequency along with the change in detection depth; and the MCU further outputs, to the big polar plate via the first second-order RC filter circuit and the third resistor, a self-calibration signal Fcal used for adjusting a phase difference between the big polar plate and the small polar plates;
- RC signals generated by the first and second RC circuits are fed back to the MCU through the signal shaping and phase comparison circuit and the filter circuit, and then processed by the MCU to judge the condition of a medium at the current detection depth; and
- the signal shaping and phase comparison circuit comprises a first NAND gate and a second NAND gate; a first input terminal of the first NAND gate is connected to the big polar plate, a second input terminal thereof is connected to an output terminal of the second NAND gate and serves as an output terminal of the signal shaping and phase comparison circuit, and an output terminal thereof is connected to a second output terminal of the second NAND gate; and, a first input terminal of the second NAND gate is connected to the small polar plates.

8. The circuit for detecting media at different depths according to claim 7, characterized in that the filter circuit is a third NAND gate.

9. The circuit for detecting media at different depths according to claim 7, characterized in that the self-calibration signal Fcal is a PWM signal with a fixed frequency and a variable duty ratio generated by the MCU, and the phase difference between the big polar plate and the small polar plates can be changed by changing the duty ratio of the PWN signal.

* * * * *